United States Patent
Kim et al.

(10) Patent No.: US 8,405,483 B2
(45) Date of Patent: Mar. 26, 2013

(54) FUSE OF SEMICONDUCTOR MEMORY DEVICE

(75) Inventors: Jeong Soo Kim, Icheon-Si (KR); Byung Wook Bae, Icheon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 472 days.

(21) Appl. No.: 12/342,388

(22) Filed: Dec. 23, 2008

(65) Prior Publication Data

US 2010/0090791 A1 Apr. 15, 2010

(30) Foreign Application Priority Data

Oct. 14, 2008 (KR) .................. 10-2008-0100822

(51) Int. Cl.
*H01H 85/12* (2006.01)
*H01H 85/04* (2006.01)
*H01H 69/02* (2006.01)
*H01L 23/52* (2006.01)
*H01L 21/44* (2006.01)

(52) U.S. Cl. ........ 337/293; 337/161; 337/284; 337/290; 257/529; 257/E23.149; 257/E21.592; 29/623; 438/601

(58) Field of Classification Search .......... 337/161, 337/284, 290, 293; 29/623; 438/601; 257/529, 257/E23.149, E21.592
See application file for complete search history.

(56) References Cited

U.S. PATENT DOCUMENTS

| | | | | |
|---|---|---|---|---|
| 4,853,758 A * | 8/1989 | Fischer | .......................... | 257/529 |
| 5,049,969 A * | 9/1991 | Orbach et al. | .................. | 257/211 |
| 5,321,300 A * | 6/1994 | Usuda et al. | .................... | 257/529 |
| 5,331,195 A * | 7/1994 | Yukihiro | ........................ | 257/529 |
| 5,420,456 A * | 5/1995 | Galbi et al. | .................... | 257/529 |
| 5,636,172 A * | 6/1997 | Prall et al. | .................... | 365/225.7 |
| 5,708,291 A * | 1/1998 | Bohr et al. | .................... | 257/529 |
| 5,729,042 A * | 3/1998 | Lou et al. | ....................... | 257/529 |
| 5,773,869 A * | 6/1998 | Froehner | ....................... | 257/529 |
| 5,844,296 A * | 12/1998 | Murray et al. | ................. | 257/529 |
| 5,933,714 A * | 8/1999 | Froehner | ....................... | 438/132 |
| 5,949,323 A * | 9/1999 | Huggins et al. | ............... | 337/401 |
| 5,986,321 A * | 11/1999 | Froehner | ....................... | 257/529 |
| 6,008,523 A * | 12/1999 | Narayan et al. | ............... | 257/529 |
| 6,054,339 A * | 4/2000 | Gilmour et al. | ............... | 438/132 |
| 6,215,173 B1 * | 4/2001 | Echigoya | ....................... | 257/665 |
| 6,225,652 B1 * | 5/2001 | Devanney | ....................... | 257/209 |
| 6,242,790 B1 * | 6/2001 | Tsui et al. | ..................... | 257/529 |
| 6,380,838 B1 * | 4/2002 | Fujii | ............................. | 337/283 |
| 6,448,626 B1 * | 9/2002 | Yoon | ............................. | 257/529 |
| 6,486,527 B1 * | 11/2002 | MacPherson et al. | ........ | 257/529 |
| 6,597,054 B1 * | 7/2003 | Prall et al. | ..................... | 257/529 |

(Continued)

FOREIGN PATENT DOCUMENTS

JP 2005-136381 A 5/2005
JP 2007-128947 A 5/2007

(Continued)

*Primary Examiner* — Bradley Thomas
(74) *Attorney, Agent, or Firm* — Marshall, Gerstein & Borun LLP

(57) ABSTRACT

A fuse used in a semiconductor memory device. The fuse is formed with a "X" shape where one circuit may be connected simultaneously to a plurality of other circuits. As a result, a fuse region is reduced, and the cutting number is also decreased, thereby lowering the possibility of defects resulting from cutting errors.

18 Claims, 10 Drawing Sheets

U.S. PATENT DOCUMENTS

| | | | |
|---|---|---|---|
| 6,649,997 B2 * | 11/2003 | Koike | 257/529 |
| 6,682,959 B2 * | 1/2004 | Bang et al. | 438/132 |
| 6,731,005 B2 * | 5/2004 | Koyama et al. | 257/758 |
| 6,750,753 B2 * | 6/2004 | Yang | 337/297 |
| 6,803,612 B2 * | 10/2004 | Lehr et al. | 257/209 |
| 6,809,404 B2 * | 10/2004 | Maki | 257/665 |
| 6,858,913 B2 * | 2/2005 | Yang | 257/529 |
| 6,900,516 B1 * | 5/2005 | Banisch et al. | 257/529 |
| 6,984,549 B1 * | 1/2006 | Manning | 438/132 |
| 7,057,217 B2 * | 6/2006 | Kang et al. | 257/209 |
| 7,153,712 B1 * | 12/2006 | Sidhu et al. | 438/17 |
| 7,227,801 B2 * | 6/2007 | Kikutake et al. | 365/225.7 |
| 7,262,479 B2 * | 8/2007 | Seo et al. | 257/529 |
| 7,312,109 B2 * | 12/2007 | Madurawe | 438/138 |
| 7,361,967 B2 * | 4/2008 | Takahashi et al. | 257/529 |
| 7,531,388 B2 * | 5/2009 | Booth et al. | 438/128 |
| 7,763,887 B2 * | 7/2010 | Han | 257/48 |
| 8,080,861 B2 * | 12/2011 | Tsuda et al. | 257/529 |
| 2003/0218932 A1 * | 11/2003 | Maki | 365/225.7 |
| 2004/0056322 A1 * | 3/2004 | Friese et al. | 257/459 |
| 2004/0057301 A1 * | 3/2004 | Lehr et al. | 365/200 |
| 2004/0178425 A1 * | 9/2004 | Kato | 257/209 |
| 2004/0262710 A1 * | 12/2004 | Ueda | 257/529 |
| 2005/0282319 A1 * | 12/2005 | Bruland et al. | 438/166 |
| 2006/0226507 A1 * | 10/2006 | Lin et al. | 257/529 |
| 2006/0289898 A1 * | 12/2006 | Kono et al. | 257/209 |
| 2007/0023861 A1 * | 2/2007 | Yang | 257/529 |
| 2007/0045783 A1 * | 3/2007 | Ohkubo et al. | 257/665 |
| 2007/0096251 A1 * | 5/2007 | Han et al. | 257/529 |
| 2007/0120232 A1 * | 5/2007 | Greco et al. | 257/665 |
| 2007/0126077 A1 * | 6/2007 | Yu | 257/529 |
| 2007/0216514 A1 * | 9/2007 | Ohtsuka et al. | 337/404 |
| 2008/0036031 A1 * | 2/2008 | Bang et al. | 257/529 |
| 2008/0179708 A1 * | 7/2008 | Ogawa | 257/529 |
| 2008/0217735 A1 * | 9/2008 | Chen et al. | 257/529 |
| 2009/0045400 A1 * | 2/2009 | Wu et al. | 257/48 |
| 2009/0141578 A1 * | 6/2009 | Bang | 365/225.7 |
| 2009/0146251 A1 * | 6/2009 | Ueda | 257/529 |
| 2009/0273056 A1 * | 11/2009 | Ohkubo et al. | 257/530 |
| 2010/0237979 A1 * | 9/2010 | Park | 337/186 |

FOREIGN PATENT DOCUMENTS

JP    2007128947 A  *  5/2007

* cited by examiner

FUSE OF SEMICONDUCTOR MEMORY DEVICE

The priority benefit of Korean Patent Application No. 10-2008-0100822, filed on Oct. 14, 2008, which is incorporated by reference in its entirety.

BACKGROUND OF THE INVENTION

The present invention generally relates to a semiconductor memory device, and more specifically, a fuse that is blown by a laser irradiated in a repair process.

If at least one memory cell of a semiconductor device has a defect in the manufacturing of the semiconductor device, the device does not serve as a memory, so that the device is regarded as being defective. However, although there is a defect in one memory cell of the memory, the device is discarded, thereby decreasing the device yield.

Currently, a defective cell is repaired with a redundancy cell which is formed in a memory device during the manufacturing process, thereby repairing the device to improve the yield.

When the defective memory cell is found through a test in a wafer state, a program to replace an address of the corresponding cell with an address signal of the redundancy cell is performed in an internal circuit. Of these programs, a widely used method is to cut a fuse using a laser beam. A wire disconnected by laser irradiation is referred to as a fuse, and the disconnected site and its surrounding region are referred to as a fuse box.

FIG. 1 is a plane diagram illustrating a fuse circuit unit of a conventional semiconductor device.

Referring to FIG. 1, fuses F1~F4 are arranged in a straight line penetrating a fuse box region 10. A metal line 20 and a contact 30 connecting the metal line 20 to each of the fuses F1~F4 are formed in both terminals of each of the fuses F1~F4. The fuses F1~F4 are formed in a single layer using a metal line or a plate electrode of a previously formed capacitor. The reference number 40 represents a blowing region where the fuse is cut by a laser beam irradiated during a repair process.

FIG. 2 is a circuit diagram illustrating the fuse circuit unit of FIG. 1.

The fuse circuit includes a plurality of fuses F1~F4 connected in parallel. One side of each of the fuses F1~F4 is connected in common to a node B so as to receive power voltage VDD through a transistor PT. The other side of each of the fuses F1~F4 are connected to repair transistors N1~N4, respectively. The repair transistors N1~N4 have each gate to receive address signals A<0>~A<3> so that the other side of each of the fuses F1~F4 may be connected to a ground voltage VSS through the transistor NT in response to the address signals A<0>~A<3>.

However, although the size of the fuse and a space between the fuses become narrower due to high integration of the semiconductor device, there is a limit to the reduction of the size of the fuse and the space between the fuses in order to blow a fuse.

While the area occupied by other circuits of the semiconductor device is reduced, a region where the fuse circuit region is formed is not decreased. As a result, the fuse region occupies a relatively larger area in the semiconductor memory device. When the fuse region occupies a large area, there is a limit in reduction of the size of the semiconductor memory device, which inhibits increase of the net number of die.

SUMMARY OF THE INVENTION

Various embodiments of the invention are directed at improving a fuse used in a semiconductor memory device to reduce the area occupied by the fuse and also decrease the cutting number of the fuse.

According to an embodiment of the invention, a fuse of a semiconductor memory device comprises: a center fuse connected to a first metal line; and a plurality of branch fuses connecting at least one terminal of the center fuse to a plurality of second metal lines.

The center fuse is formed to have a given critical dimension with a bar type in a different layer from the first metal line. The critical dimension of the center fuse is the same as or larger than that of the branch fuse. The center fuse is formed in a metal-2 (MT2) layer. The first metal line is formed in a metal-1 (MT1) layer.

The center fuse and the plurality of branch fuses are formed to be integrated with a "X" shape in the same layer. The first metal line is formed in parallel to the center axis of the center fuse or to intersect the center axis of the center fuse.

The plurality of branch fuses are formed to be symmetrical. Each of the branch fuses is formed to proceed with a given angle from the center axis of the center fuse and bend in parallel to the center axis.

According to an embodiment of the invention, a fuse of a semiconductor memory device comprises: a first radial fuse connecting a first metal line simultaneously to a plurality of third metal lines; and a second radial fuse connecting the first metal line simultaneously to a plurality of fourth metal lines.

The first or second radial fuses includes: a center fuse connected to the first metal line; and a plurality of branch fuses connecting at least one terminal of the center fuse to the third or fourth metal lines.

DESCRIPTION OF SPECIFIC EMBODIMENTS

Figure 3:
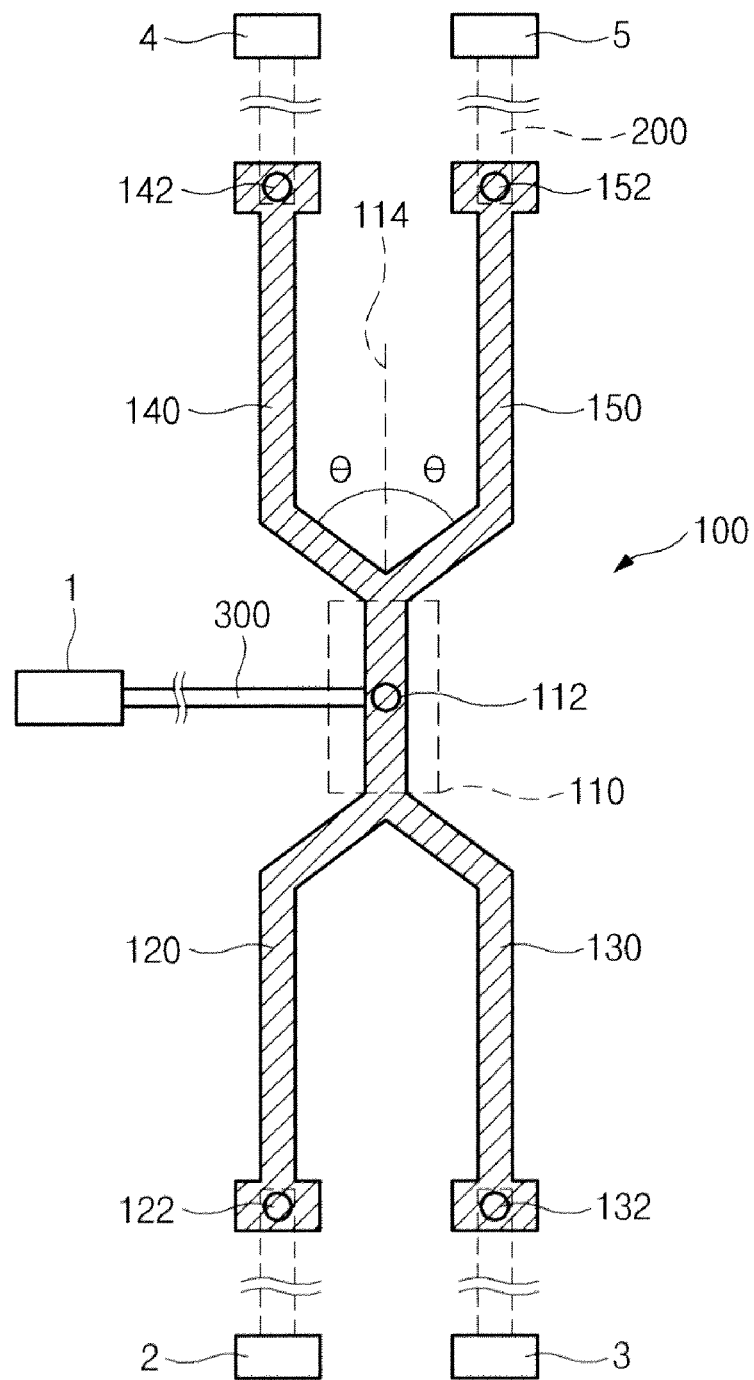
FIG. 3 is a plane diagram illustrating a fuse according to an embodiment of the invention.

FIG. 3 is a plane diagram illustrating a fuse according to an embodiment of the invention.

Referring to FIG. 3, a fuse 100 includes a "X"-shaped radial fuse configured to connect one circuit 1 to a plurality of circuits 2~5 (four circuits in the embodiment of the invention). That is, while a conventional fuse formed to have a line pattern that connects two circuits one by one, the radial fuse 100 connects three or more circuits 1~5 simultaneously.

Hereinafter, the disclosed fuse 100 is described in further detail.

The radial fuse 100 comprises a center fuse 110 and branch fuses 120~150.

The center fuse 110 has a bar type with a given width and both terminals of the center fuse 110 are connected to the branch fuses 120~150. The center fuse 110 is connected to a center contact 112 for connection with a metal line 300. Preferably, the center contact 112 is connected to the center of the center fuse 110, and the metal line 300 is formed in a different layer from the center fuse 110 so as to be coupled with the circuit 1. For example, the center fuse 110 is formed at a metal-2 (MT2) layer, and the metal line 300 is formed at a metal-1 (MT1) layer. The metal line 300 may be patterned when the metal-1 (mT1) is patterned. The circuit 1 connected through the metal line 300 may correspond to a PMOS transistor PT supplying power voltage VDD to fuses F1~F4 of FIG. 2. The center contact 112 may correspond to a node B where a plurality of fuses are connected in common to the circuit 1. Since the branch fuses 120~150 are commonly connected to the center fuse 110, the critical dimension of the center fuse 110 is preferably formed to be larger than that of the branch fuses 120~150.

The branch fuses 120~150 branch out from both terminals of the center fuse 110 so as to connect both terminals of the center fuse 110 to a plurality of different metal lines 200 through branch contacts 122, 132, 142, and 152. The branch fuses are symmetrically connected to both terminals of the center fuse 110. As shown in FIG. 3, the four branch fuses 120~150 are connected to both terminals of the center fuse 110 symmetrically with a pair. For example, the two branch fuses 120 and 130 are symmetrically connected to one terminal of the center fuse 110, and the branch fuses 140 and 150 are symmetrically connected to the other terminal of the center fuse 110. The branch fuses 120 and 130 connected to one terminal of the center fuse 110 are symmetrical with the branch fuses 140 and 150 connected to the other terminal of the center fuse 110.

In order to reduce the area occupied by the fuses when a plurality of radial fuses are formed in parallel, each branch fuse 120~150 is not arranged in a straight line but bent with a given angle to have a line type. That is, each of the branch fuses 120~150 includes a line fuse formed to proceed with a given angle (θ) from a center axis 114 of the center fuse 110 and to bend in parallel to the center axis 114. The circuits 2~5 connected to the branch fuses 120~150, respectively, through the metal line 200 correspond to NMOS transistor N1~N4 in FIG. 2.

The center fuse 110 and the branch fuses 120~150, which will be distinguished from each other for ease of explanation, are actually integrated in the same layer by one patterning process. The radial fuse 100 may be patterned when a plate electrode or the metal-2 (MT2) of a capacitor is patterned.

A blowing region in the radial fuse 100 is a region in parallel to the center axis in each branch fuse 120~150 and both terminals (or a region between both terminals and the center contact 112) of the center fuse 110. Blowing method will be explained in further detail.

Figure 1:
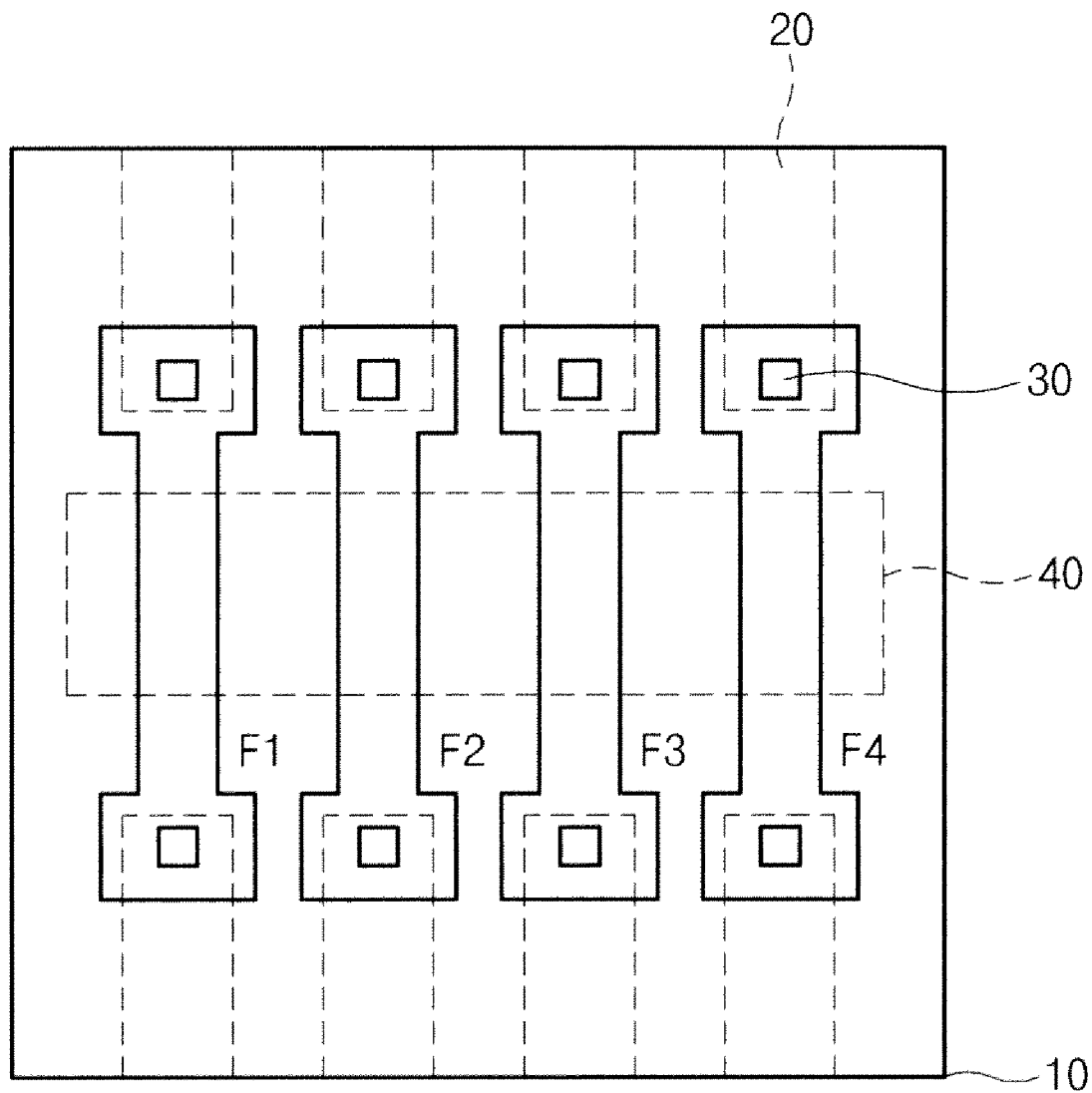
FIG. 1 is a plane diagram illustrating a fuse circuit unit of a conventional semiconductor device.
Figure 2:
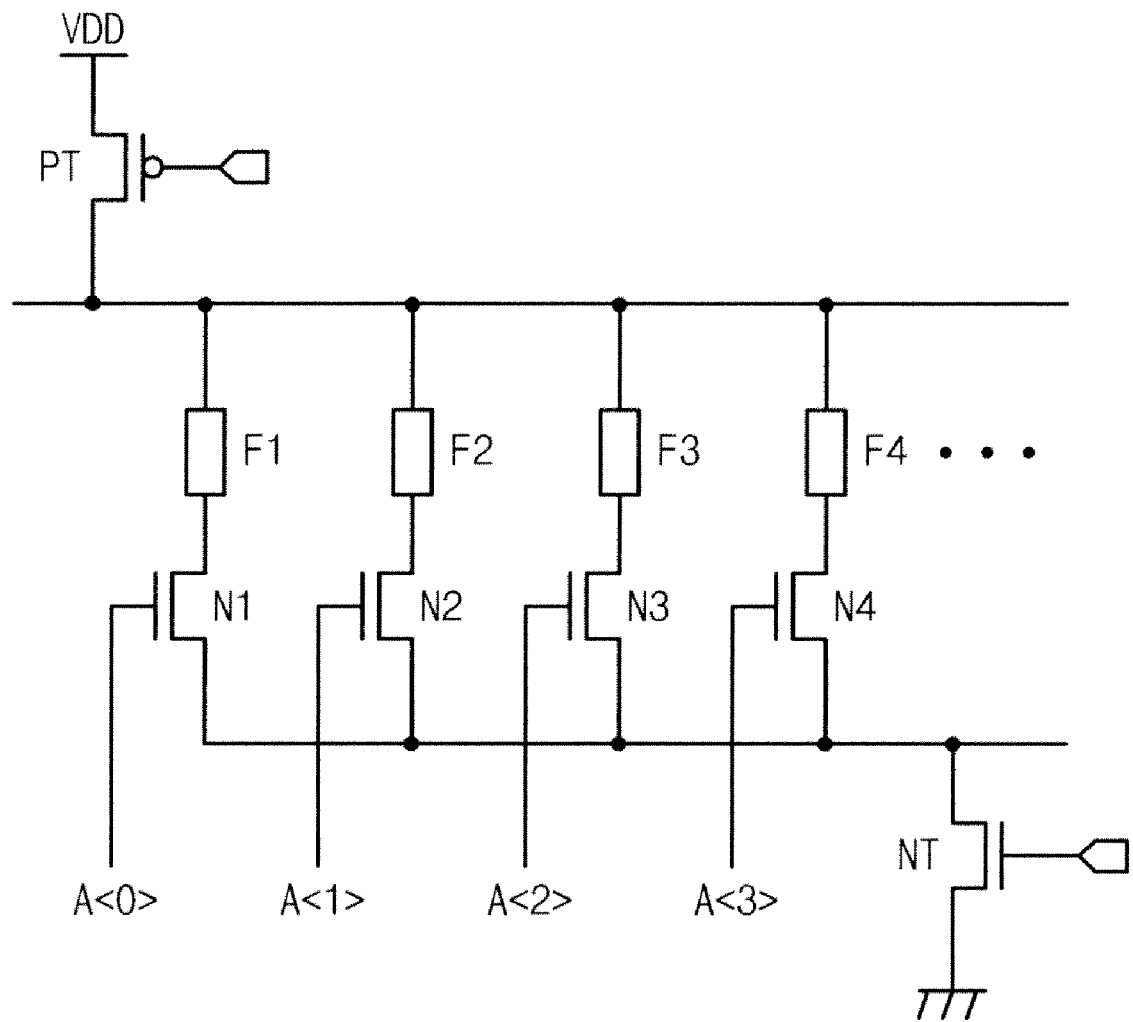
FIG. 2 is a circuit diagram illustrating the fuse circuit unit of FIG. 1.
Figure 4:
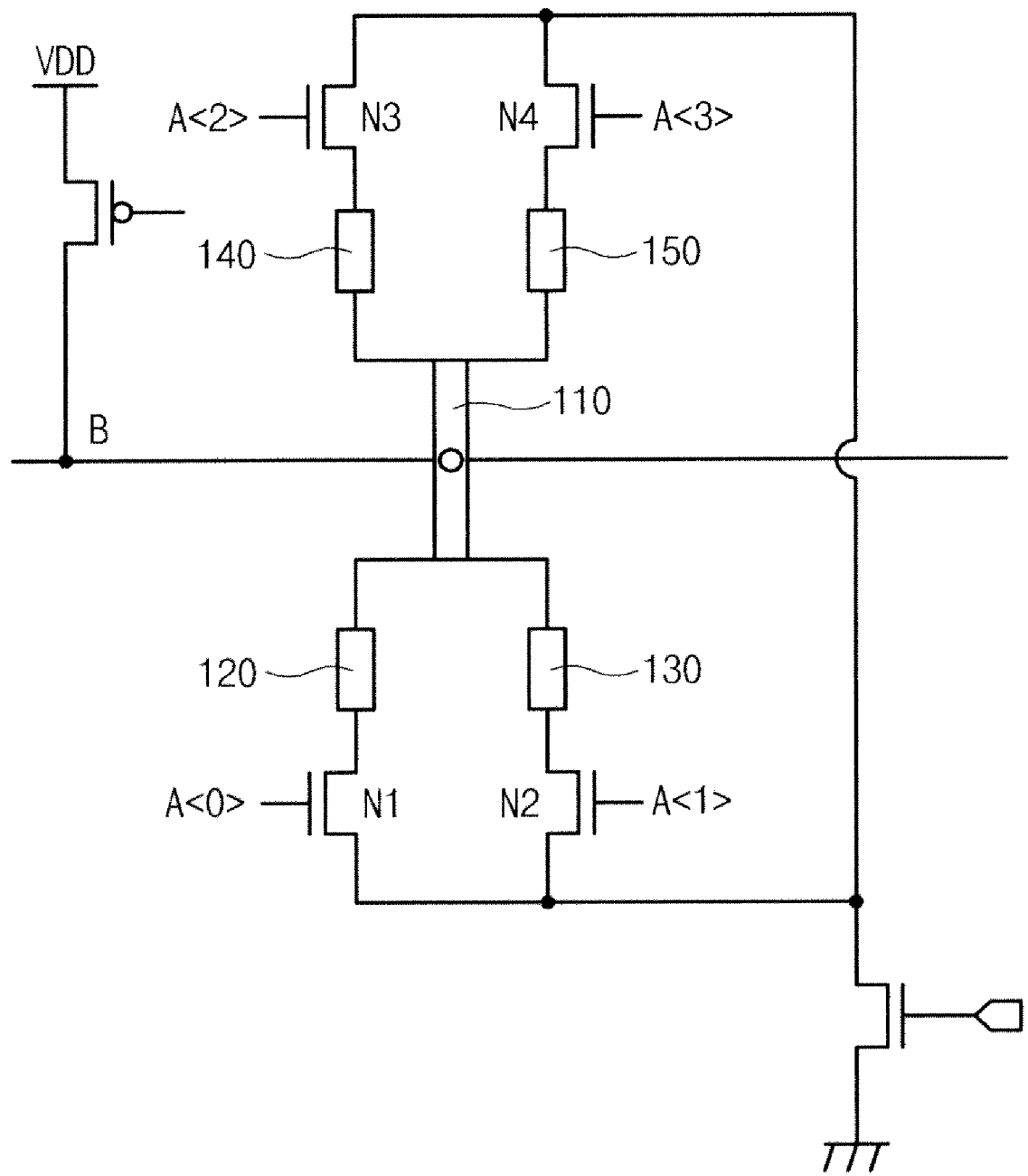
FIG. 4 is a circuit diagram illustrating the fuse circuit unit of FIG. 2 reconfigured as a radial fuse type of FIG. 3.

FIG. 4 is a circuit diagram re-illustrating the circuit diagram of the FIG. 2 with the radial fuse 100 of the FIG. 3.

In comparison of the circuit diagram of FIG. 4 with that of FIG. 2, it is shown to have the same function.

That is, when one radial fuse 100 as shown in FIG. 3 is used, the same function can be performed when the four bar-type fuses F1~F4 are used. As a result, the area occupied by the fuses can be reduced when the radial fuse is used.

Figure 5:
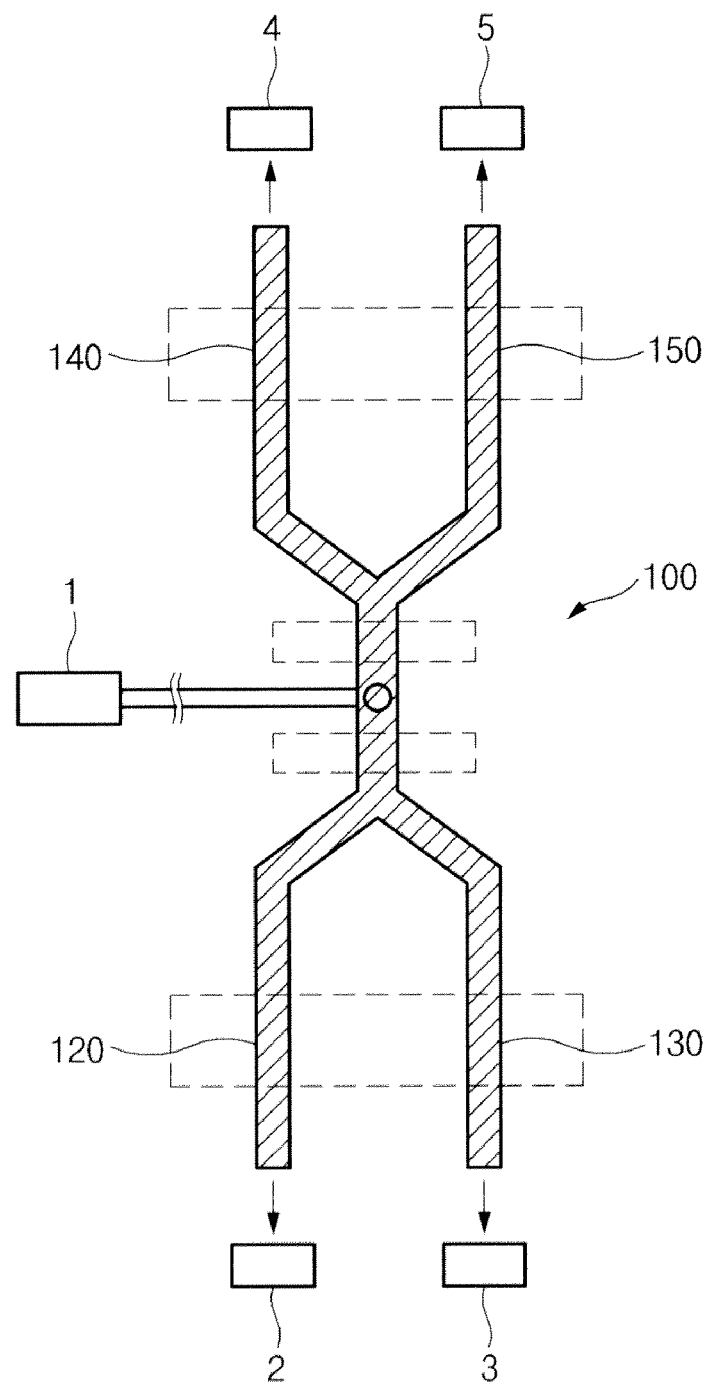
FIG. 5 is a diagram illustrating a blowing region irradiated with a laser beam in the radial fuse of FIG. 3.

FIG. 5 is a diagram illustrating a blowing region irradiated with a laser beam in the radial fuse 100 of FIG. 3. The blowing method of the radial fuse 100 is described with reference to FIG. 5.

The region blown by a laser beam in the radial fuse 100 is a region represented with a dotted line in FIG. 5, that is, a region in parallel to the center axis in each branch fuse 120~150 and both terminals [or a region between both terminals and the center contact 112].

When the radial fuse 100 is used, one blowing process can disconnect the connection between two or more circuits.

That is, when a connection between the circuits 1 and 2 or go between the circuits 1 and 3 is disconnected, a laser beam is irradiated to the blowing region of the branch fuse 120 or 130 to blow the corresponding region. In the same way, when a connection between the circuits 1 and 4 or between the circuits 1 and 5 is disconnected, a laser beam is irradiated to the blowing region of the branch fuse 140 or 150 to blow the corresponding region.

However, when connection between the circuit 1 and the two circuits 2, 3 are disconnected, a laser beam is not irradiated to the branch fuse 120 or 130, but a laser beam is irradiated to terminals connected to the branch fuses 120 and 130 in the center fuse 110 (or a region between the terminal and the center contact 112), thereby disconnecting the connection with the two circuits 2 and 3 simultaneously.

The radial fuse 100 can reduce the cutting number of the fuses, thereby lowering possibility of errors that may be generated in fuse blowing.

Figure 6:
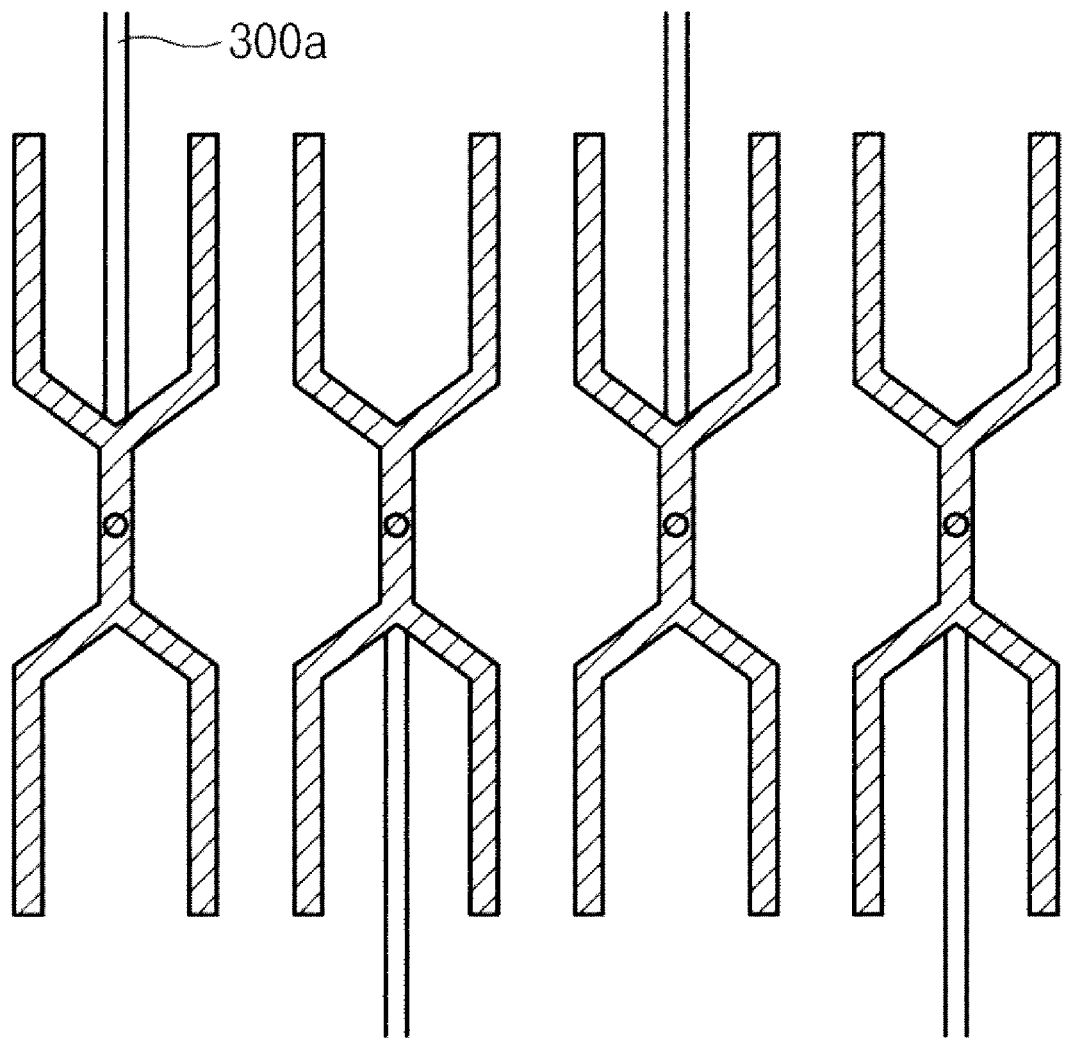
FIGS. 6 to 8 are diagrams illustrating a metal line connected to a center contact when a plurality of the radial fuses of FIG. 3 are formed successively.
Figure 7:
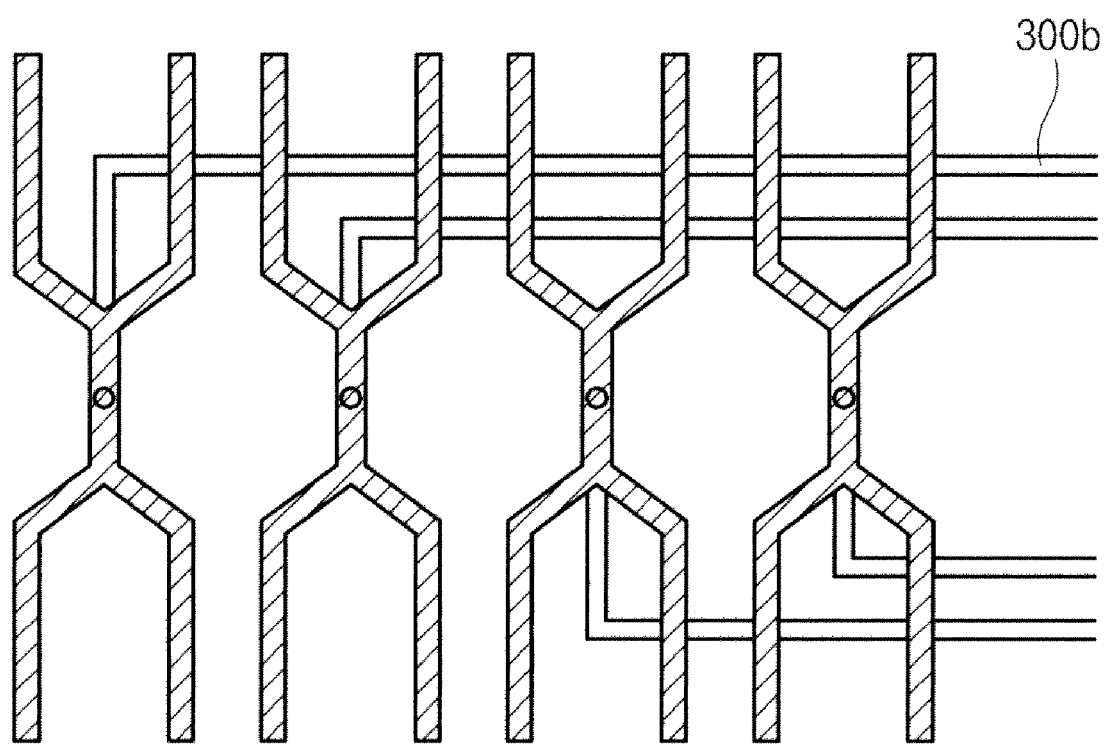
Figure 8:
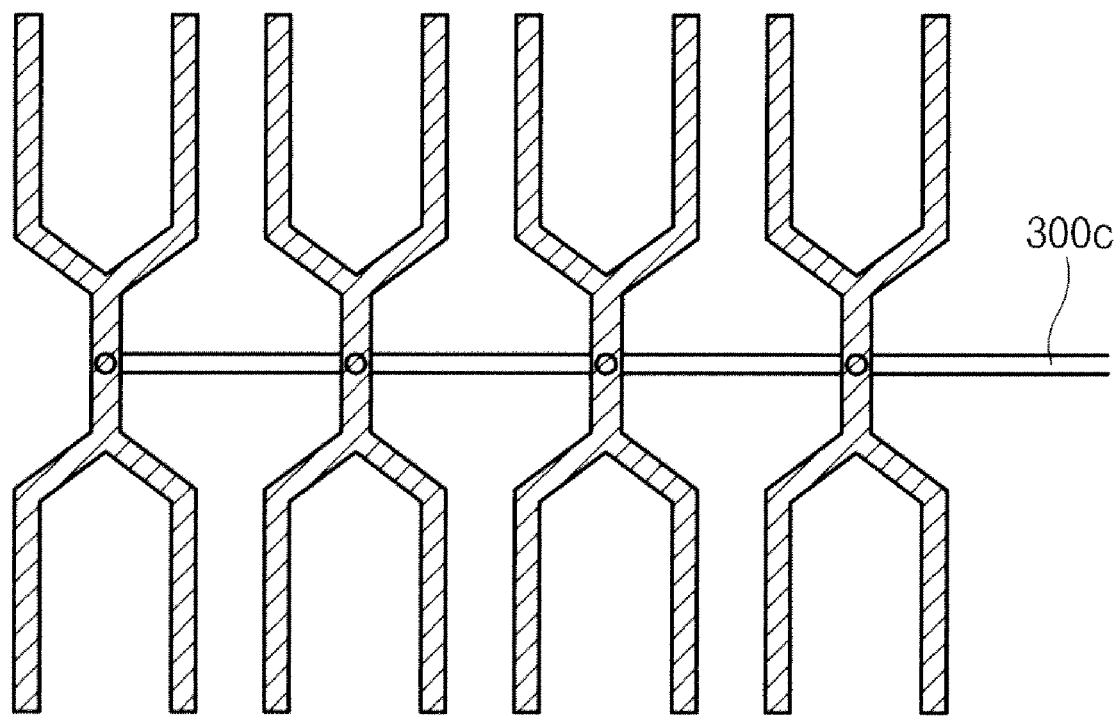

FIGS. 6 to 8 are diagrams illustrating the metal line 300 connected to the center contact 112 when a plurality of the radial fuses of FIG. 3 are formed successively.

FIG. 6 shows a diagram when a metal line is formed in each radial fuse while a metal line 300a is formed in parallel to the center axis 114 of the center fuse 110. The metal lines of the adjacent radial fuse are alternately drawn out in opposite directions with each other, thereby securing a space between the metal lines.

FIG. 7 shows a diagram when a metal line is formed in each radial fuse while a metal line 300b is formed to intersect the center axis 114 of the center fuse 110. Preferably, the metal lines are divided into both sides as shown in FIG. 7 so as to secure a sufficient distance between the metal lines.

FIG. 8 shows a diagram when a metal line is not formed in each radial fuse but one metal line 300 is connected in common to the center contact of the radial fuses while a metal line 300c is formed to intersect the center axis 114 of the center fuse 110. In this case, the width of the metal line 300c is preferably formed to be larger than that of the metal lines 300a of FIG. 6 or 300b of FIG. 7.

In the embodiment of the invention, the fuse is formed to be radial with a "X" shape so that one circuit may be connected to other circuits, thereby reducing the fuse region for high integration of the semiconductor device.

Although the length of the fuse may be longer when the fuse is formed to be radial with a "X" shape, the resulting region is not enlarged. For example, the length may be reduced by a method of decreasing the length of the blowing region.

Figure 9:
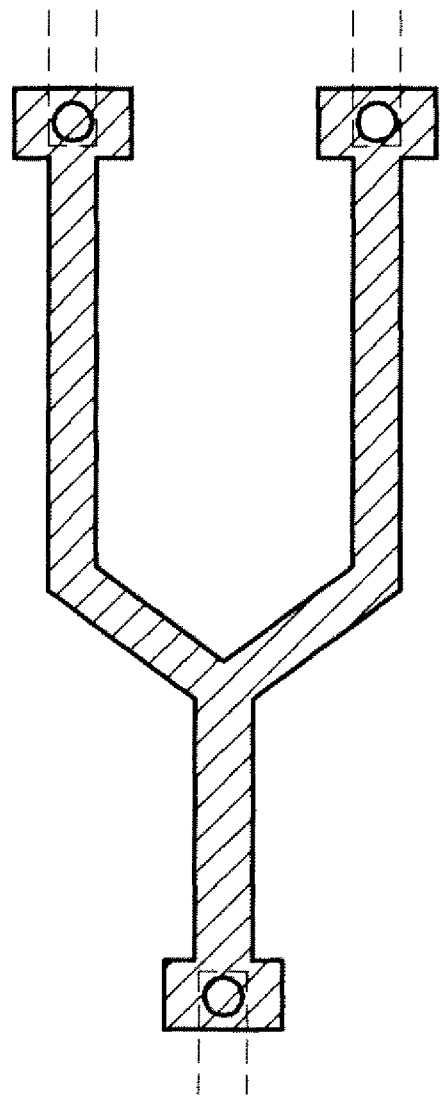
FIG. 9 is a plane diagram illustrating a fuse according to another embodiment of the invention.

FIG. 9 is a plane diagram illustrating a fuse according to another embodiment of the invention.

Referring to FIG. 9, a fuse 400 is formed to have a "Y" shape for connecting one circuit simultaneously to two other circuits.

The "Y" shaped fuse is similar to a shape when the "X"-shaped radial fuse of FIG. 3 is divided to be symmetrical vertically based on the center contact. That is, in the "Y"- shaped fuse, one terminal of the center fuse is connected simultaneously to two branch fuses, and the other terminal is connected to a circuit through the metal line.

Figure 10:
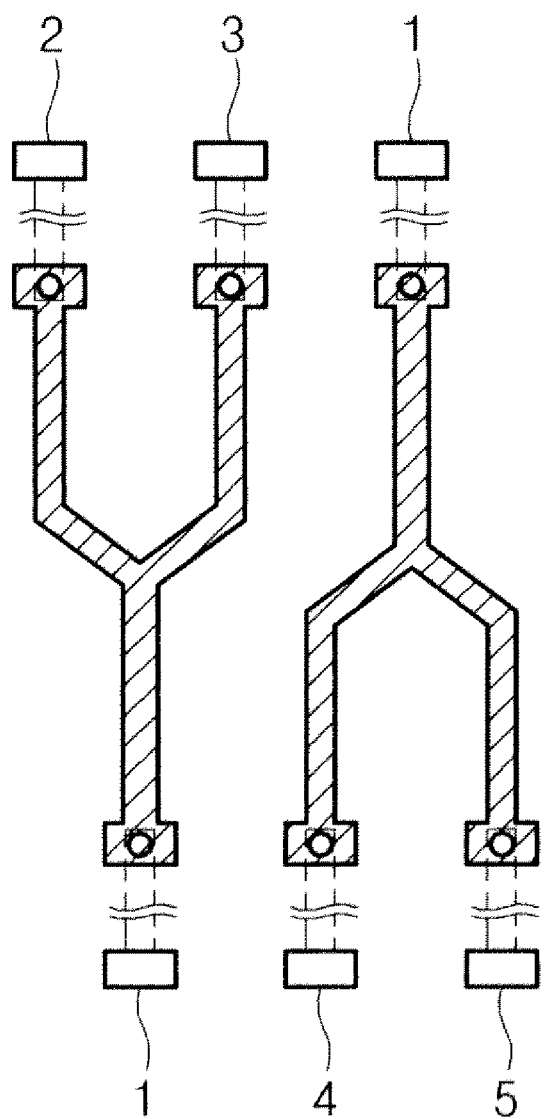
FIG. 10 is a diagram illustrating the two fuses of FIG. 9 that have the same function as that of the fuse of FIG. 3.

In order to perform the same function as that of the "X"-shaped fuse, the two "Y"-shaped fuses are required as shown in FIG. 10.

FIG. 10 is a diagram illustrating the two fuses of FIG. 9 that have the same function as that of the fuse of FIG. 3.

When the "Y"-shaped fuses are formed successively, in order to reduce the area occupied by the fuses, the neighboring fuses are formed in opposite directions with each other as shown in FIG. 10.

Although the "X"-shaped fuses are distinguished from the "Y"-shaped fuses in the above embodiments, both fuses can be used together depending on how many fuses are formed.

For example, when 30 fuses are required, one "Y"-shaped is fuse may be formed after seven "X"-shaped fuses are formed successively as shown in FIGS. 6 to 8.

The above embodiments of the disclosure are illustrative and not limitative. Various alternatives and equivalents are possible. The invention is not limited by the type of deposition, etching polishing, and patterning steps describe herein. Nor is the invention limited to any specific type of semiconductor device. For example, the disclosure may be implemented in a dynamic random access memory (DRAM) device or non-volatile memory device. Other additions, subtractions, or modifications are obvious in view of the present disclosure and are intended to fall within the scope of the appended claims.

What is claimed is:

1. A fuse of a semiconductor memory device, the fuse comprising:
    a center fuse coupled to a first metal line through a contact and having a first blowing region and a second blowing region;
    a plurality of first branch fuses coupling a first terminal of the center fuse to a plurality of second metal lines; and
    a plurality of second branch fuses coupling a second terminal of the center fuse to a plurality of third metal lines,
    wherein a blowing region of the first and second branch fuses runs parallel to the center fuse, wherein the first blowing region connects the contact and the plurality of first branch fuses selectively depending on the blowing of the first blowing region, and the second blowing region connects the contact and the plurality of second branch fuses selectively depending on the blowing of the second blowing region.

2. The fuse according to claim 1, wherein the center fuse has a given critical dimension with a bar type.

3. The fuse according to claim 2, wherein the critical dimension of the center fuse is the same as or larger than that of the plurality of branch fuses.

4. The fuse according to claim 1, wherein the center fuse comprises a different layer from the first metal line.

5. The fuse according to claim 4, wherein the center fuse is a metal-2 (MT2) layer.

6. The fuse according to claim 5, wherein the first metal line is a metal-1 (MT1) layer.

7. The fuse according to claim 6, wherein the first metal line is parallel to a center axis of the center fuse.

8. The fuse according to claim 6, wherein the first metal line intersects the center axis of the center fuse.

9. The fuse according claim 1, wherein the center fuse, the plurality of first branch fuses, and the plurality of second branch fuses are integrated with an "X" shape in the same layer.

10. The fuse according to claim 1, wherein the plurality of first branch fuses and the plurality of second branch fuses are symmetrical.

11. The fuse according to claim 1, wherein each of the branch fuses proceeds with a given angle from the center axis of the center fuse and bends in parallel to the center axis.

12. A fuse of a semiconductor memory device, the fuse comprising:
    a first radial fuse connecting a first metal line simultaneously to a plurality of second and third metal lines; and
    a second radial fuse connecting the first metal line simultaneously to a plurality of fourth and fifth metal lines,
    wherein the first radial fuse includes:
    a first center fuse coupled to the first metal line through a first contact and having a first blowing region and a second blowing region;
    a plurality of first branch fuses coupling a first terminal of the first center fuse to the plurality of second metal lines; and
    a plurality of second branch fuses coupling a second terminal of the first center fuse to the plurality of third metal lines,
    wherein a blowing region of the first and second branch fuses runs parallel to the first center fuse, wherein the first blowing region connects the contact and the plurality of first branch fuses selectively depending on the blowing of the first blowing region and the second blowing region connects the contact and the plurality of second branch fuses selectively depending on the blowing of the second blowing region.

13. The fuse according to claim 12, wherein the first metal line has a line type intersecting with the first radial fuse and the second radial fuse.

14. The fuse according to claim 12, wherein the first center fuse, the plurality of first branch fuses, and the plurality of second branch fuses are integrated with an "X" shape in the same layer.

15. The fuse according to claim 12, wherein the first branch fuses and the second branch fuses are symmetrical.

16. The fuse according to claim 12, wherein the second radial fuse includes:
    a second center fuse connected to the first metal line; and
    a plurality of third branch fuses connecting a first terminal of the second center fuse to the fourth metal lines; and
    a plurality of fourth branch fuses connecting a second terminal of the second center fuse to the plurality of fifth metal lines,
    wherein a blowing region of the third and fourth branch fuses runs parallel to the second center fuse.

17. The fuse according to claim 16, wherein the second center fuse, the plurality of third branch fuses, and the plurality of fourth branch fuses are integrated with an "X" shape in the same layer.

18. The fuse according to claim 16, wherein the third branch fuses and the fourth branch fuses are symmetrical at both terminals of the center fuse.

* * * * *